United States Patent
Nishida et al.

(10) Patent No.: US 7,118,625 B2
(45) Date of Patent: Oct. 10, 2006

(54) LIQUID PHASE GROWTH METHOD FOR SILICON CRYSTAL, MANUFACTURING METHOD FOR SOLAR CELL AND LIQUID PHASE GROWTH APPARATUS FOR SILICON CRYSTAL

(75) Inventors: Shoji Nishida, Nara (JP); Takehito Yoshino, Nara (JP); Masaaki Iwane, Nara (JP); Masaki Mizutani, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 275 days.

(21) Appl. No.: 10/676,094

(22) Filed: Oct. 2, 2003

(65) Prior Publication Data
US 2004/0065251 A1  Apr. 8, 2004

(30) Foreign Application Priority Data
Oct. 8, 2002 (JP) ............................. 2002-294897

(51) Int. Cl.
*C30B 25/12* (2006.01)
(52) U.S. Cl. ............................. 117/54; 117/11; 117/59; 117/60; 117/64; 117/77; 117/934
(58) Field of Classification Search ............... 117/11, 117/54, 59, 60, 64, 77, 934
See application file for complete search history.

(56) References Cited

U.S. PATENT DOCUMENTS

| 4,571,448 A | 2/1986 | Barnett ..................... 136/259 |
| 6,391,108 B1 * | 5/2002 | Nishida et al. ............... 117/77 |

FOREIGN PATENT DOCUMENTS

| DE | 22-38205 | 2/1974 |
| JP | 58-89874 | 5/1983 |
| JP | 11-292693 | 10/1999 |

\* cited by examiner

*Primary Examiner*—Felisa Hiteshew
(74) *Attorney, Agent, or Firm*—Fitzpatrick, Cella, Harper & Scinto (57) ABSTRACT

With respect to a liquid phase growth method for a silicon crystal in which the silicon crystal is grown on a substrate by immersing the substrate in a solvent or allowing the substrate to contact the solvent, a gas containing a raw material and/or a dopant is supplied to the solvent after at least a part of the gas is decomposed by application of energy thereto. In this manner, a liquid phase growth method for a silicon crystal, the method capable of achieving continuous growth and suitable for mass production, a manufacturing method for a solar cell and a liquid phase growth apparatus for a silicon crystal are provided.

22 Claims, 5 Drawing Sheets

LIQUID PHASE GROWTH METHOD FOR SILICON CRYSTAL, MANUFACTURING METHOD FOR SOLAR CELL AND LIQUID PHASE GROWTH APPARATUS FOR SILICON CRYSTAL

BACKGROUND OF THE INVENTION

1. Field of the Invention

The present invention relates to a liquid phase growth method for a silicon crystal, a manufacturing method for a solar cell and a liquid phase growth apparatus for a silicon crystal. In particular, the present invention relates to a liquid phase growth method for a silicon crystal, the method capable of achieving continuous growth and suitable for mass production, a manufacturing method for a solar cell including the same and a liquid phase growth apparatus for a silicon crystal, the apparatus used for these methods.

2. Description of the Related Art

A liquid phase growth method has the advantage that a high quality crystal having a composition close to the stoichiometric composition can be prepared because of crystal growth in a quasi-equilibrium state, and the method is thereby used as an established technology with respect to compound semiconductors, e.g., GaAs, for production of light-emitting diodes (LEDs), laser diodes and the like. Recently, liquid phase growth of Si has been attempted for the purpose of preparing a thick film, and an application to solar cells has been discussed, as disclosed in Japanese Patent Laid-Open No. 58-89874.

In generally known liquid phase growth methods, a solution containing a material targeted for growing, as a solute, is cooled to become supersaturated and, thereby, an excessive solute (a material targeted for growing) is deposited on a substrate. At that time, the solute must be dissolved into the solvent to saturation in advance of deposition (growth) of the solute on the substrate.

Common methods for dissolving a solute in a solvent include the case where a solute is mixed with a solvent while the amount of the solute is adjusted to bring about saturation at a dissolution temperature, followed by heating, and the case where heating is performed while a solvent is in contact with a large amount of (more than the amount required for saturation) base material composed of the solute, followed by keeping at a dissolution temperature to bring about saturation. In the former case, a newly-weighed solute is put into the solvent every time the growth is terminated, or the solvent is replaced with a fresh solvent including the solute. In the latter case, a base material to become the solute is put into the solvent or is pulled out of the solvent before the growth or after the growth and, finally, the base material is consumed to cause troubles in putting in or pulling out or cause shortage in the amount of dissolution. Consequently, replacement with a fresh base material is required. In all cases, apparatuses are stopped or the growth is suspended in order to replenish when raw materials are run out, so that time loss occurs. As described above, known methods have problems with respect to mass production.

Lertes (DE No. 2238205) discloses a method for directly supplying a solute from a gas phase into a solvent, in which a $SiH_4$ gas (a raw material gas) is allowed to contact the solvent surface. However, in this case, the $SiH_4$ gas is allowed to two-dimensionally contacts the solvent surface, Si atoms generated by decomposition at the solvent surface diffuse into the solvent to reach the surface of a growth substrate and, thereby, supply of Si is achieved. Consequently, the amount of supply of Si is not sufficient for achieving a practical growth rate.

Japanese Patent Laid-Open No. 11-292693 discloses a liquid phase growth method for a silicon crystal and a manufacturing method for a solar cell including the same. In the liquid phase growth method for a silicon crystal, a raw material gas containing at least silicon atoms is blown into a solvent, the raw material gas is decomposed while the silicon atoms are simultaneously dissolved into the above-described solvent and, thereby, the silicon atoms are supplied to the above-described solvent. Subsequently, a substrate is immersed in the solvent or is allowed to contact the solvent and, thereby, a silicon crystal is grown on the substrate. According to this proposition, the raw material can be continuously supplied in practice.

However, even in the liquid phase growth method disclosed in Japanese Patent Laid-Open No. 11-292693, the supply efficiency of the raw material and/or the dopant to the solvent must be improved in order to further increase the growth rate and to change a doping profile at will.

SUMMARY OF THE INVENTION

The present invention was made in consideration of the above-described problems. Accordingly, it is an object of the present invention to provide a liquid phase growth method for a silicon crystal, which can improve the supply efficiency of a raw material and/or a dopant to a solvent and which is simple and suitable for mass production, and to provide a manufacturing method for a solar cell including the same and a liquid phase growth apparatus for a silicon crystal, which is used for these methods.

In order to overcome the above-described problems, a liquid phase growth method for a silicon crystal according to the present invention, in which a silicon crystal is grown on a substrate by immersing the substrate in a solvent or allowing the substrate to contact the solvent, includes the step of supplying a gas containing a raw material and/or a dopant to the above-described solvent after at least a part of the above-described gas is decomposed by application of energy to the gas. In the present invention and the present specification, the raw material refers to a substance to become a raw material for a silicon crystal, and typical examples thereof include silanes and derivatives thereof, e.g., halogenated silanes and disilane.

A manufacturing method for a solar cell according to the present invention includes at least a step of forming a silicon layer by liquid phase growth, and further includes the step of supplying a gas containing a raw material and/or a dopant to a solvent after at least a part of the above-described gas is decomposed by application of energy to the gas.

A first liquid phase growth apparatus for a silicon crystal according to the present invention includes a device for holding a solvent to dissolve a raw material for silicon, a device for immersing a substrate in the solvent or allowing the substrate to contact the solvent, a device for supplying a gas containing at least a raw material and/or a dopant to the above-described solvent and an energy application device upstream to the gas supply device in order to decompose at least a part of the above-described gas containing the raw material and/or the dopant.

A second liquid phase growth apparatus for a silicon crystal according to the present invention includes a solvent receiver for holding a solvent to dissolve silicon atoms, a raw material gas feed pipe having gas blowoff holes in the solvent held in the solvent receiver, an energy application chamber which is connected to the raw material gas feed pipe and which applies energy to a gas passing through the raw material gas feed pipe outside the solvent receiver, a wafer cassette which holds substrates and which can be put into the solvent and be pulled out of the solvent held in the solvent receiver at will and a heating device for heating the above-described solvent.

A third liquid phase growth apparatus for a silicon crystal according to the present invention includes a solvent receiver for holding a solvent to dissolve silicon atoms, a growth vessel for performing liquid phase growth on a substrate, a pipe for circulating the solvent between the solvent receiver and the growth vessel, a raw material gas feed pipe having gas blowoff holes in the solvent held in the above-described solvent receiver, an energy application chamber which is connected to the raw material gas feed pipe and which applies energy to a gas passing through the raw material gas feed pipe outside the solvent receiver, a wafer cassette which holds substrates and which can be put into the solvent and be pulled out of the solvent held in the solvent receiver at will and a heating device for heating the above-described solvent.

A fourth liquid phase growth apparatus for a silicon crystal according to the present invention includes a solvent receiver for holding a solvent to dissolve silicon atoms, a pipe for circulating the solvent, the pipe having both ends connected to the solvent receiver and having an opening other than both the ends, a raw material gas feed pipe having gas blowoff holes in the solvent held in the solvent receiver, an energy application chamber which is connected to the raw material gas feed pipe and which applies energy to a gas passing through the raw material gas feed pipe outside the solvent receiver, a holding component for holding a substrate in order that the substrate is allowed to contact the solvent at the above-described opening and a heating device for heating the above-described solvent.

Further objects, features and advantages of the present invention will become apparent from the following description of the preferred embodiments with reference to the attached drawings.

DESCRIPTION OF THE PREFERRED EMBODIMENTS

Embodiments of the present invention will be described below with reference to drawings. However, the present invention is not limited to these embodiments.

Figure 1:
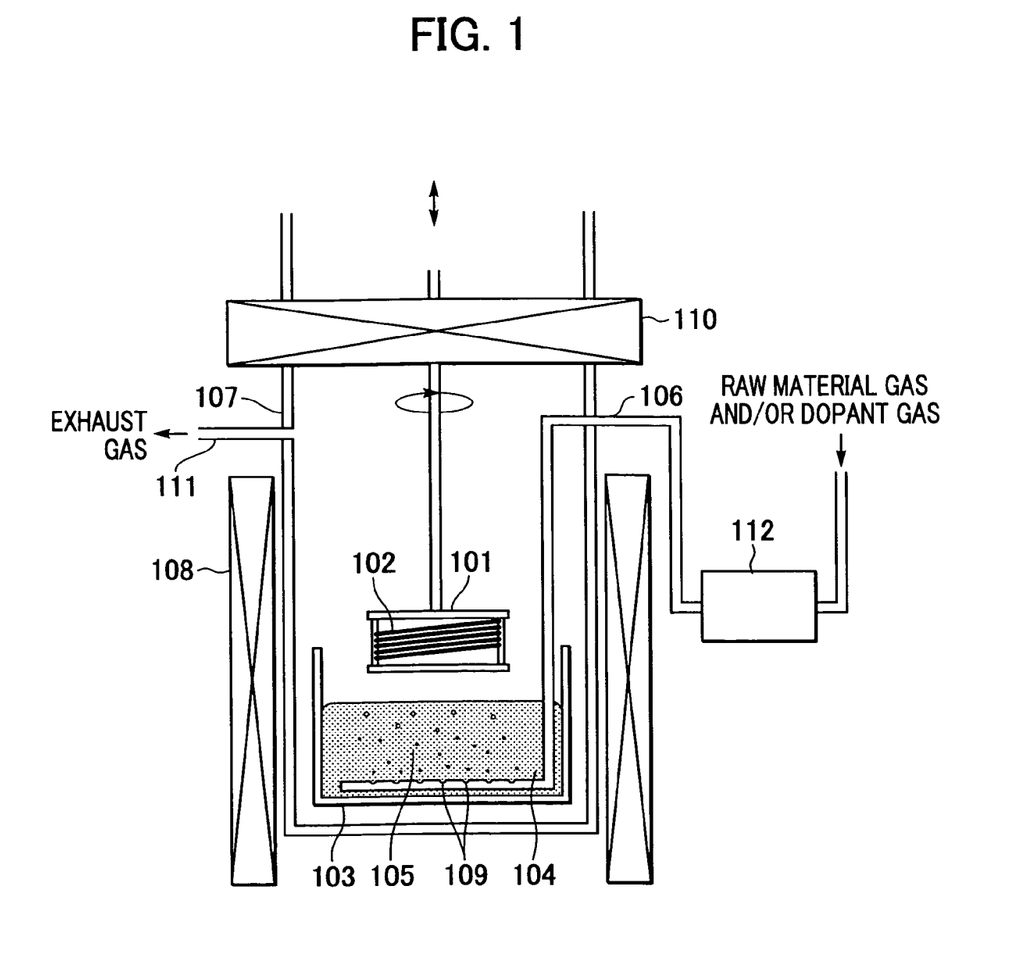
FIG. 1 is a sectional view schematically showing an example of a liquid phase growth apparatus according to the present invention.

FIG. 1 is a sectional view schematically showing an example of a liquid phase growth apparatus used for a liquid phase growth method according to the present invention. In FIG. 1, reference numeral 101 denotes a wafer cassette, reference numeral 102 denotes a substrate (wafer), reference numeral 103 denotes a solvent receiver (crucible), reference numeral 104 denotes a solvent (melt), reference numeral 105 denotes a reaction product gas, reference numeral 106 denotes a raw material gas feed pipe, reference numeral 107 denotes a reaction tube, reference numeral 108 denotes an electric furnace (heater) and reference numeral 112 denotes an energy application device connected to the raw material gas feed pipe 106. Reference numeral 109 denotes gas blowoff holes provided at the end portion of the raw material gas feed pipe 106, reference numeral 110 denotes a gate valve and reference numeral 111 denotes an exhaust hole.

The liquid phase growth method and the liquid phase growth apparatus of the present invention will be described below with reference to FIG. 1. As shown in FIG. 1, the solvent 104 made of a metal (hereafter referred to as a "metal solvent") is filled in the solvent receiver (crucible) 103 made of carbon, the raw material gas feed pipe 106 is provided along the side wall and the bottom of the crucible 103. The energy application device 112 for decomposing a raw material gas and/or a dopant gas is provided upstream to the raw material gas feed pipe. The wafer cassette 101 carrying the wafers 102 is located above the crucible 103, and by the vertical movement thereof, the wafers 102 are immersed in the metal solvent 104 or the wafers 102 are pulled up from the metal solvent 104, so that a growth starting treatment/growth termination treatment is performed. Since the wafer cassette 101 is provided with a rotation mechanism as well, thicknesses of the growing film can be made uniform in the wafer surface and among the wafers by rotating the wafer cassette 101 during growth. The crucible 103, the raw material gas feed pipe 106 and the wafer cassette 101 are contained in the reaction tube 107, and are heated with the electric furnace 108 serving as a heating device disposed on the exterior of the reaction tube 107.

A specific procedure of the liquid phase growth method of the present invention will be described below. The metal solvent 104 not reached saturation or the metal solvent 104 after growth is terminated is heated to a predetermined temperature (a temperature slightly higher than the temperature during growth), followed by keeping to stabilize.

A raw material gas, e.g., $SiH_4$, as a supply source of Si, is fed into the raw material gas feed pipe 106 through the energy application device 112, and a decomposed raw material gas is injected into the metal solvent 104 from the gas blowoff holes 109 opened at the end portion of the raw material gas feed pipe 106, so that the decomposed raw material gas and the metal solvent 104 are allowed to contact with each other. In the case where $SiH_4$ is used as the raw material gas and, for example, plasma discharge is used as the energy application device 112, $SiH_4$ is decomposed into $SiH_3$, $SiH_2$, SiH, Si, $H_2$ and the like, these are supplied into the metal solvent 104 through the raw material gas feed pipe 106, and are immediately decomposed into Si atoms to dissolve into the metal solvent 104. At this time, the metal solvent 104 is agitated by $H_2$ molecules generated and, therefore, dissolution of Si atoms into the solvent is accelerated. However, an agitation mechanism (not shown in the drawing) may be separately provided to intentionally agitate.

After the decomposed raw material gas is blown into the metal solvent 104 for a predetermined time, the raw material gas is stopped, and the electric furnace 108 is controlled to perform gradual cooling. When the temperature has reached the growth starting temperature, the wafer cassette 101 is moved downward, and the wafer 102 is immersed in the metal solvent 104. Preferably, the wafer cassette 101 is rotated at a speed of a few revolutions per minute during growth in order that the thickness of the growing film becomes uniform.

After a lapse of a predetermined growth time, the wafer cassette 101 is pulled up from the metal solvent 104, so that the growth is terminated. In the present embodiment, since the wafers 102 are arranged with a predetermined inclination in the wafer cassette 101, the metal solvent 104 hardly remains on the surface of the wafer at that point in time when the wafer 101 is pulled up from the metal solvent 104. However, the metal solvent 104 may slightly remain at the portion (support portion) where the wafer 102 and the wafer cassette 101 are in contact with each other. In this case, the remaining metal solvent 104 can be flung away by rotating the wafer cassette at a rotation speed of a few tens of revolutions per minute or more.

Subsequently, the wafer cassette 101 is pulled up into a preliminary chamber (not shown in the drawing) provided separately from the reaction tube 107, and the wafers 102 are replaced. The above-described steps are repeated and, thereby, the liquid phase growth can be continuously performed.

In the present invention, when the raw material gas and/or the dopant gas and the metal solvent are allowed to contact each other, and the raw material is continuously supplied into the solvent, energy can be applied to the raw material gas and/or the dopant gas in advance. Consequently, the decomposition efficiency is increased than ever, the supply efficient of the raw material and the dopant to the solvent is improved, and the suitability for mass production can be further improved.

In the present invention, the dopant concentration in the solvent can be adjusted by appropriately changing the ratio between the amounts of flow of the raw material gas and the dopant gas supplied. That is, the dopant concentration in the silicon layer grown in the solvent may be changed depending on the growth condition of the crystal. However, even in this case, the dopant concentration can be adjusted at a constant by controlling the ratio between the amounts of flow of the raw material gas and the dopant gas. Conversely, the dopant profile in the silicon layer can also be intentionally changed.

The materials suitable for use as the solvent receiver 103 to contain the metal solvent 104 used in the present invention and the wafer cassette 101 to support the wafers 102 are, primarily, high purity carbon, high purity quartz or the like. Likewise, the high purity carbon, the high purity quartz or the like is suitable for use as the material for the raw material gas feed pipe 106 used in the present invention, and the high purity quartz is suitable for use as the material for the reaction tube 107.

Examples of raw materials (raw material gases) suitable for use include, for example, silanes represented by $Si_nH_{2n+2}$ (where n represents a natural number), e.g., $SiH_4$ and $Si_2H_6$, and halogenated silanes, e.g., $SiH_2Cl_2$, $SiHCl_3$, $SiCl_4$, $SiH_2F_2$ and $SiH_2F_6$. Examples of dopants (typically, doping gases supplied by addition to the raw material gas, although may be supplied separately from the raw material gas, as a matter of course) suitable for use include, for example, $PH_3$, $PF_3$, $AsH_3$, $SbH_3$, $B_2H_6$, $BF_3$, $BCl_3$, $Ga(CH_3)_3$ and $Ga(C_2H_5)_3$.

Preferably, hydrogen ($H_2$) is added to the above-described raw material gas in order to serve as a carrier gas or to establish a reducing atmosphere for accelerating growth of the crystal. The ratio of the amount of the above-described raw material gas to that of hydrogen ($H_2$) is appropriately determined in accordance with a forming method, the type of the raw material gas and, furthermore, the condition of the formation. However, the ratio between the amounts of feed flow is preferably 1:1,000 or more and 100:1 or less, and more preferably, is 1:100 or more and 10:1 or less.

The energy application device 112 used in the present invention is selected from heat, plasma, a catalyst and light. With respect to the heat, those like a quartz reactor provided with a heater on the exterior are suitable for use. In the case where the plasma serves as the energy application device, those like a common plasma CVD apparatus provided with a discharge device and a reaction chamber are suitable for use. In the case where the catalyst is used, those having a structure in which the raw material gas and/or the doping gas is blown on a tungsten wire allowed to become red-hot by passing current are suitable for use. In the case where the light is used, those like the quartz reactor are suitable for use in order that the raw material gas and/or the doping gas can be irradiated with light (primarily, ultraviolet light) through them (those like the quartz reactor) while a large optical absorption coefficient of the raw material gas and/or the doping gas is exhibited with respect to the light. In the case where the plasma or the light is used, as necessary, other atoms or molecules may be fed into the reaction chamber in order to efficiently transfer the above-described energy to the raw material gas and/or the doping gas. These atoms or molecules temporally absorb the plasma or optical energy, and transfer the energy to the raw material gas and/or the doping gas so as to decompose the raw material gas and/or the doping gas. A very small amount of mercury vapor, an argon gas, a $H_2$ gas and the like are suitable for use as the above-described energy mediation material.

The decomposition efficiency of the raw material gas and/or the doping gas can be improved with the energy application device 112 of the present invention by within the range of several percent to several tens percent (40% or more) although the extent thereof is changed depending on the type and the configuration of the energy application device 112 to be used.

Examples of solvents suitable for use in the present invention include metal solvents made of In, Sn, Bi, Ga, Sb and the like. Epitaxial growth is performed by allowing the solvent and decomposed raw material gas and/or doping gas to contact with each other to dissolve Si atoms and/or dopants into the solvent, followed by gradually cooling the solvent, or by allowing the solvent to have a temperature gradient therein while Si atoms and/or dopants are supplied into the solvent from decomposed raw material gas and/or doping gas.

The temperature and the pressure in the liquid phase growth method used in the present invention are changed depending on the forming method, the type of the raw material (gas) to be used and the like. However, for example, in the case where silicon is grown by using Sn or In as the solvent, the temperature of the solvent is desirably controlled at 600° C. or more and 1,050° C. or less. Preferably, the pressure is about $10^{-2}$ Torr to 760 Torr, and more preferably, is within the range of $10^{-1}$ Torr to 760 Torr.

EXAMPLES

The growth of a desired crystal by the liquid phase growth method of the present invention will be described below in detail with reference to examples. However, the present invention is not specifically limited to these examples.

Example 1

In Example 1, an epitaxial layer of Si was grown through the use of a liquid phase growth apparatus having the configuration shown in FIG. 1. A solvent was In, and a raw material gas was $SiH_4$. A wafer cassette 101 carrying five 5"-Si wafers 102 was arranged in a preliminary chamber (not shown in the drawing) and, therefore, was in a standby state. A solvent receiver 103 containing the In solvent 104 was heated with a heater 108, and the temperature of the solvent was maintained at a constant 960° C. Here, 5" refers to that the diameter of the wafer is 5 inches.

A gate valve 110 was opened. The wafer cassette 101 on standby in the preliminary chamber was put in the reaction tube 107, and was held directly above the solvent receiver 103. The gate valve 110 was kept open during the following steps.

The raw material gas $SiH_4$ and a $H_2$ gas (a ratio of the amounts of gas flow of $SiH_4:H_2=1:20$) were fed into a raw material gas feed pipe 106 through an energy application device 112 (a plasma reaction chamber), and were injected into the In solvent 104. These gases were kept on flowing for 20 minutes. With respect to the plasma condition, discharge power of 350 W was applied between opposed electrodes at atmospheric pressure.

After the required gas was flowed, gradual cooling of the solvent in the reaction tube 107 was started at a rate of −1° C./min while the electric furnace 108 was controlled. When the temperature of the In solvent 104 reached 950° C., the wafer cassette 101 was moved down while being rotated at a rotation speed of 10 rpm, and was put into the In solvent 104. When the wafer cassette 101 was completely immersed in the In solvent 104, the downward movement was stopped, and liquid phase growth was performed for 60 minutes while the wafer cassette 101 was rotated at the same location.

Subsequently, the wafer cassette 101 was pulled up from the In solvent 104, and was suspended directly above the solvent receiver 103. The rotation speed was increased to 120 rpm and, thereby, a part of In remaining on the wafer cassette was flung away, so that the liquid phase growth was completed.

The cross section of the grown epitaxial silicon layer was observed with a scanning electron microscope and a transmission electron microscope. As a result, it was verified that the thickness of the grown epitaxial silicon layer was about 15 μm and the crystallinity was excellent.

Comparative Example 1

For purposes of comparison, the raw material gas was injected into the In solvent 104 under the same condition as that in Example 1 except that the energy application device 112 was not used. Sufficient amount was unable to supply into the In solvent in the period of 20 minutes, and 30 minutes or more were required to saturate the solvent with Si.

Example 2

In Example 2, an epitaxial layer of Si was grown and impurity doping was simultaneously performed through the use of the liquid phase growth apparatus having the configuration shown in FIG. 1. A solvent was In, a raw material gas was $SiH_4$ and the impurity doping gas was $B_2H_6$. The wafer cassette 101 carrying five 5"-Si wafers 102 was arranged in the preliminary chamber (not shown in the drawing) and, therefore, was in a standby state. The solvent receiver 103 containing the In solvent 104 was heated with an electric furnace 108, and the temperature of the solvent was maintained at a constant 960° C.

The gate valve 110 was opened. The wafer cassette 101 on standby in the preliminary chamber was put in the reaction tube 107, and was held directly above the solvent receiver 103. The gate valve 110 was kept open during the following steps.

The raw material gas $SiH_4$, the doping gas $B_2H_6$ and a $H_2$ gas (a ratio of the amounts of gas flow of $SiH_4:H_2=1:20$ and $B_2H_6/SiH_4=0.01$) were fed into the raw material gas feed pipe 106 through the energy application device 112 (a plasma reaction chamber), and were injected into the In solvent 104. These gases were kept on flowing for 20 minutes. With respect to the plasma condition, discharge power of 350 W was applied between the opposed electrodes at atmospheric pressure.

After the required gas was flowed, gradual cooling of the solvent in the reaction tube 107 was started at a rate of −1° C./min while the electric furnace 108 was controlled. When the temperature of the In solvent 104 reached 950° C., the wafer cassette 101 was moved down while being rotated at a rotation speed of 10 rpm, and was put into the In solvent 104. When the wafer cassette 101 was completely immersed in the In solvent 104, the downward movement was stopped, and liquid phase growth was performed for 60 minutes while the wafer cassette 101 was rotated at the same location.

Subsequently, the wafer cassette 101 was pulled up from the In solvent 104, and was suspended directly above the solvent receiver 103. The rotation speed was increased to 120 rpm and, thereby, a part of In remaining on the wafer cassette was flung away, so that the liquid phase growth was completed.

The cross section of the grown epitaxial silicon layer was observed with a scanning electron microscope and a transmission electron microscope. As a result, it was verified that the thickness of the grown epitaxial silicon layer was about 15 μm and the crystallinity was excellent.

Comparative Example 2

For purposes of comparison, the raw material gas was injected into the In solvent 104 under the same condition as that in Example 2 except that the energy application device 112 was not used. Sufficient amount was unable to supply into the In solvent in the period of 20 minutes, and 30 minutes or more were required to saturate the solvent with Si.

Comparisons were made between the amount of the impurities (dopants) B contained in a silicon layer grown through the use of the energy application device 112 and that contained in a silicon layer grown through the use of no energy application device 112 by secondary ion mass spectrometry. In the case where the energy application device was used, the concentration of detected B was about two orders of magnitude higher than that in the other case. In this manner, it was made clear that the efficiency of doping to the grown silicon layer was improved than ever by the liquid phase growth method of the present invention.

Example 3

Figure 5:
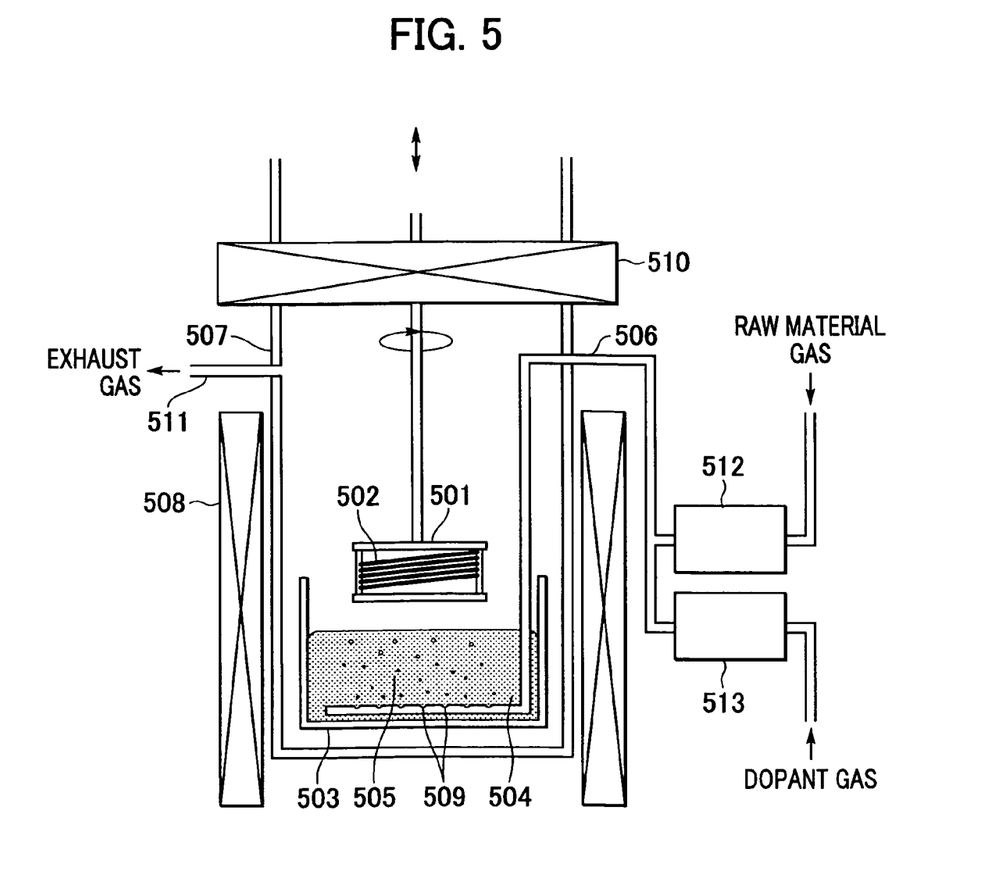
FIG. 5 is a sectional view schematically showing an example of a liquid phase growth apparatus according to the present invention, in which two energy application devices are included.

In Example 3, an epitaxial layer of Si was grown and impurity doping was simultaneously performed through the use of a liquid phase growth apparatus having the configuration shown in FIG. 5. A solvent was In, a raw material gas was $SiH_4$ and an impurity doping gas was $PH_3$. A wafer cassette 501 carrying five 5"-Si wafers 502 was arranged in a preliminary chamber (not shown in the drawing) and, therefore, was in a standby state. A solvent receiver 503 containing the In solvent 504 was heated with a heater 508, and the temperature of the solvent was maintained at a constant 960° C.

The gate valve 510 was opened. The wafer cassette 501 on standby in the preliminary chamber was put in a reaction tube 507, and was held directly above the solvent receiver 503. The gate valve was kept open during the following steps.

The raw material gas $SiH_4$ and a $H_2$ gas (a ratio of the amounts of gas flow of $SiH_4:H_2=1:20$) were fed into the raw material gas feed pipe 506 through the energy application device 512 (a plasma reaction chamber), the doping gas $PH_3$ and a $H_2$ gas (a ratio of the amounts of gas flow of $PH_3:H_2=1:10$, and a ratio of the amounts of gas flow of $PH_3/SiH_4=0.01$ after $PH_3$ and $SiH_4$ were joined) were fed into the raw material gas feed pipe 506 through the energy application device 513 (a plasma reaction chamber), and were injected into the In solvent 504. These gases were kept on flowing for 20 minutes. With respect to the plasma condition of both of the energy application device 512 (the raw material gas $SiH_4$+the $H_2$ gas) and the energy application device 513 (the doping gas $PH_3$+the $H_2$ gas), discharge power of 350 W was applied between the opposed electrodes at atmospheric pressure.

After the required gas was flowed, gradual cooling of the solvent in the reaction tube 507 was started at a rate of −1° C./min while the electric furnace 508 was controlled. When the temperature of the In solvent 504 reached 950° C., the wafer cassette 501 was moved down while being rotated at a rotation speed of 10 rpm, and was put into the In solvent 504. When the wafer cassette 501 was completely immersed in the In solvent 504, the downward movement was stopped, and liquid phase growth was performed for 60 minutes while the wafer cassette 501 was rotated at the same location.

Subsequently, the wafer cassette 501 was pulled up from the In solvent 504, and was suspended directly above the solvent receiver 503. The rotation speed was increased to 120 rpm and, thereby, a part of In remaining on the wafer cassette was flung away, so that the liquid phase growth was completed.

The cross section of the grown epitaxial silicon layer was observed with a scanning electron microscope and a transmission electron microscope. As a result, it was verified that the thickness of the grown epitaxial silicon layer was about 15 μm and the crystallinity was excellent.

A silicon layer was grown under the same condition as that described above except that the plasma condition of the energy application device 513 was changed (the discharge power was changed to 20 W). The amount of impurities (dopants) P contained in the silicon layer grown while the plasma conditions of the energy application device 512 and the energy application device 513 were adjusted to be the same (the discharge power was 350 W) and that contained in the silicon layer grown while the plasma conditions of the energy application device 512 and the energy application device 513 were adjusted to be different from each other (the discharge power of the 512 was 350 W, and the discharge power of the 513 was 20 W) were compared by secondary ion mass spectrometry. As a result, the concentration of detected P in the former case was about three orders of magnitude higher than that in the latter case. In this manner, according to the liquid phase growth method of the present invention, the concentration of doping to the grown silicon layer can be easily controlled, and a doping profile can be achieved in a wide range.

Example 4

Figure 3:
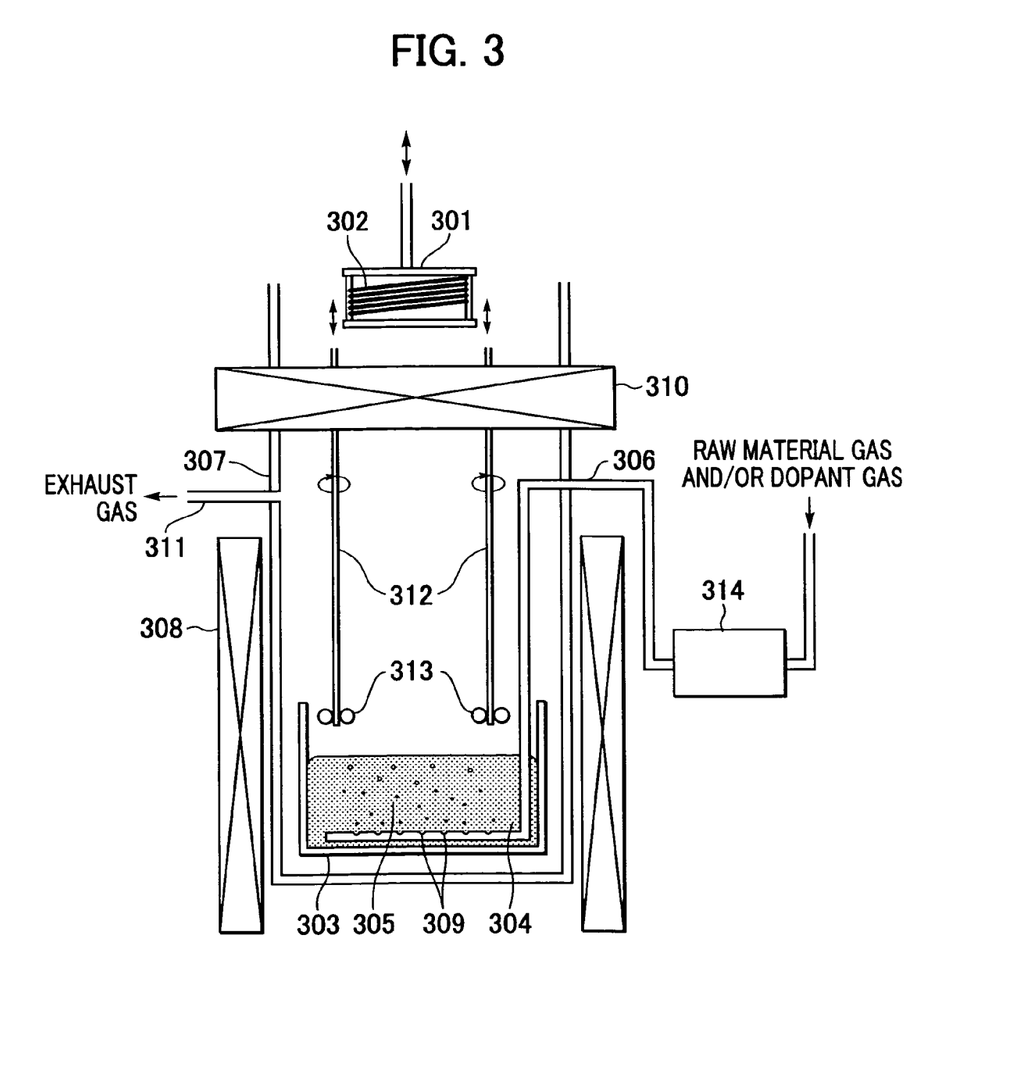
FIG. 3 is a sectional view schematically showing an example of a liquid phase growth apparatus according to the present invention, in which a mechanical agitation device is included.

In Example 4, an epitaxial layer of Si was grown through the use of a liquid phase growth apparatus having the configuration shown in FIG. 3 and concurrent use of mechanical agitation devices (agitation mechanisms) for dissolving a solute in a solvent. The solvent was In, and a raw material gas was $SiH_2Cl_2$. The agitation mechanisms 312 were arranged in a preliminary chamber (not shown in the drawing) and, therefore, were in a standby state. A solvent receiver 303 containing the In solvent 304 was heated with an electric furnace 308, and the temperature of the solvent was maintained at a constant 960° C.

A gate valve 310 was opened. The agitation mechanisms 312 on standby in the preliminary chamber were put in the reaction tube 307, and was held directly above the solvent receiver 303. The gate valve was kept open during the following steps.

The raw material gas $SiH_2Cl_2$ and a $H_2$ gas (a ratio of the amounts of gas flow of $SiH_2Cl_2:H_2=1:100$) were fed into a raw material gas feed pipe 306 through an energy application device 314 (a quartz reactor provided with a heater on the exterior), and were injected into the In solvent 304. At this time, the heater temperature of the energy application device 314 was adjusted at 1,050° C.

The agitation mechanisms 312 were moved down while being rotated at a rotation speed of 20 rpm, and was put into the In solvent 304. When the impellers 313 were sufficiently immersed in the In solvent, the downward movement was stopped, and the gas was kept on flowing for 15 minutes while the impellers 313 were kept at the same location and agitation was performed.

After the required gas was flowed, the agitation mechanisms 312 were pulled up to the preliminary chamber. Subsequently, a wafer cassette 301 carrying five 5"-Si wafers 302 was put in the reaction tube 307 from the preliminary chamber, and was held directly above the solvent receiver 303 for 10 minutes.

Gradual cooling of the solvent in the reaction tube 307 was started at a rate of −1.5° C./min while the electric furnace 308 was controlled. When the temperature of the In solvent 304 reached 950° C., the wafer cassette 301 was moved down while being rotated at a rotation speed of 10 rpm, and was put into the In solvent 304. When the wafer cassette 301 was completely immersed in the In solvent 304, the downward movement was stopped, and liquid phase growth was performed for 45 minutes while the wafer cassette 301 was rotated at the same location.

Subsequently, the wafer cassette 301 was pulled up from the In solvent 304, and was suspended directly above the solvent receiver 303. The rotation speed was increased to 120 rpm and, thereby, a part of In remaining on the wafer cassette was flung away, so that the liquid phase growth was completed. In FIG. 3, reference numeral 305 denotes a reaction product gas, reference numeral 309 denotes a gas blowoff hole and reference numeral 311 denotes an exhaust hole.

The cross section of the grown epitaxial silicon layer was observed with a scanning electron microscope and a transmission electron microscope. As a result, it was verified that the thickness of the grown epitaxial silicon layer was about 15 µm and the crystallinity was excellent.

Comparative Example 3

For purposes of comparison, the raw material gas was injected into the In solvent 304 under the same condition as that in Example 4 except that the energy application device 314 was not used. Sufficient amount was unable to supply to the In solvent in the period of 15 minutes, and 20 minutes or more were required to saturate the solvent with Si.

Example 5

Figure 2:
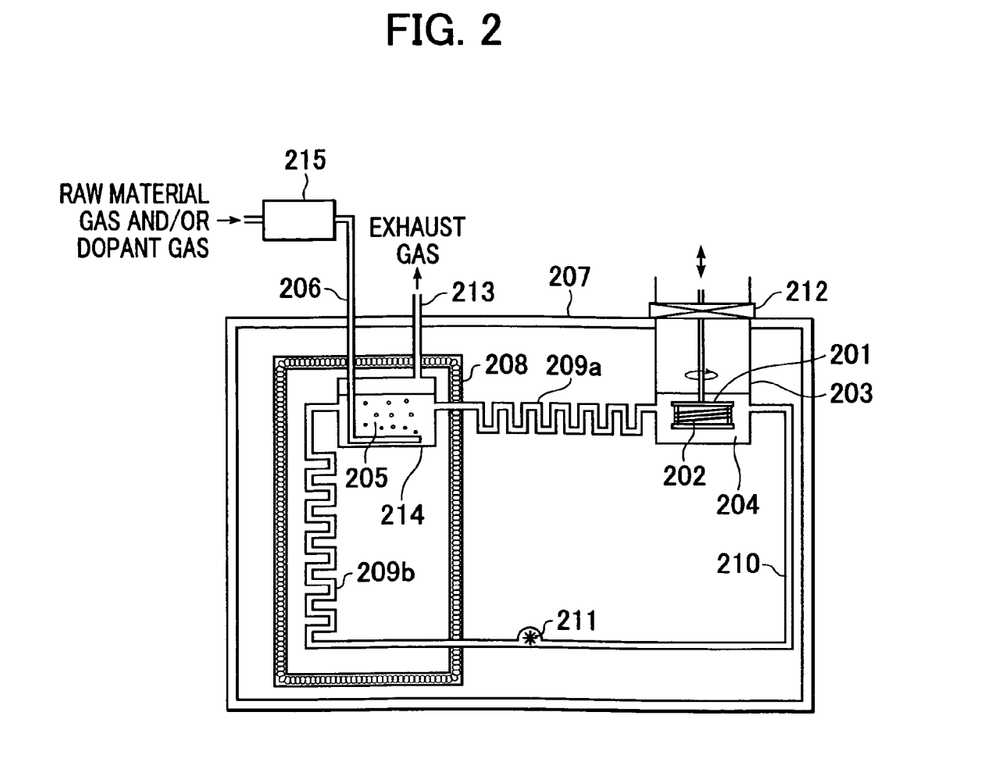
FIG. 2 is a sectional view schematically showing an example of a liquid phase growth apparatus according to the present invention, in which dissolution of silicon and liquid phase growth can be simultaneously performed.

In Example 5, an epitaxial layer of Si was grown through the use of a liquid phase growth apparatus shown in FIG. 2. A solvent was Sn, and a raw material gas was $SiH_4$.

With respect to the apparatus shown in FIG. 2, a quartz solvent receiver 214 and quartz pipes 209a, 210 and 209b are disposed in an electric furnace 207, while the pipe 209a is connected to one side surface of the solvent receiver 214 and a growth vessel 203 for immersing a wafer cassette 201 carrying substrates (wafers) 202, the pipe 210 is connected to the growth vessel 203, and the pipe 209b is connected to the other side surface of the solvent receiver 214. The pipes 209a and 209b serve as heat exchangers. Furthermore, the solvent receiver 214 and the heat exchanger 209b are surrounded by a heater block 208 and, therefore, the temperature can be controlled separately. Reference numeral 211 denotes a circulation rotor, reference numeral 212 denotes a gate valve, reference numeral 215 denotes an energy application device, reference numeral 206 denotes a raw material gas feed pipe and reference numeral 213 denotes an exhaust hole. Reference numeral 204 denotes a solvent and reference numeral 205 denotes a reaction product gas.

The solvent 204 was Sn sufficiently purified in a hydrogen atmosphere. The solvent 204 was filled in the solvent receiver 214, the growth vessel 203 and the quartz pipes 209a, 210 and 209b. The temperature in the electric furnace 207 was maintained at a constant 950° C. The temperature of the solvent receiver 214 was adjusted by the heater block 208 at 10° C. higher than the temperature in the electric furnace 207 outside the heater block 208, and the solvent 204 was circulated through the use of the rotor 211.

After a lapse of sufficient time, the gate valve 212 was opened. The wafer cassette 201 carrying beforehand five 5"-p$^+$(100) Si wafers (wafers which were doped with relatively many p-type dopants and in which a principal plane had (100) plane orientation) 202 was put in the growth vessel 203 from a preliminary chamber (not shown in the drawing), and was held directly above the Sn solvent receiver 204. The raw material gas $SiH_4$ and a $H_2$ gas (a ratio of the amounts of gas flow of $SiH_4:H_2=1:30$) were fed into the raw material gas feed pipe 206 through the energy application device 215 (a reaction chamber provided with a tungsten wire), and were injected into the Sn solvent 204 in the solvent receiver 214. These gases were kept on flowing. At this time, current was passed through the tungsten wire to heat the wire to 1,600° C., and the raw material gas $SiH_4$ and the $H_2$ gas was blown onto the heated wire.

After a lapse of 20 minutes, the wafer cassette 201 was moved down while being rotated at a rotation speed of 10 rpm, and was put into the Sn solvent 204 in the growth vessel 203. When the wafer cassette 201 was completely immersed in the Sn solvent 204, the downward movement was stopped, and liquid phase growth was performed for 60 minutes while the wafer cassette 201 was rotated at the same location.

The wafer cassette 201 was pulled up from the Sn solvent 204, and was suspended directly above the Sn solvent 204. The rotation speed was increased to 150 rpm and, thereby, a part of Sn remaining on the wafer cassette 201 was flung away, so that the liquid phase growth was completed.

The cross section of the grown epitaxial silicon layer was observed with a scanning electron microscope and a transmission electron microscope. As a result, it was verified that the thickness of the grown epitaxial silicon layer was about 20 µm and the crystallinity was excellent.

Comparative Example 4

For purposes of comparison, the liquid phase growth was performed under the same condition as that in Example 5 except that the energy application device 215 was not used. The thickness of the grown epitaxial silicon layer was in the order of 15 µm. Consequently, the grown film had a larger thickness when the above-described energy application device 215 was used.

Example 6

Figure 4:
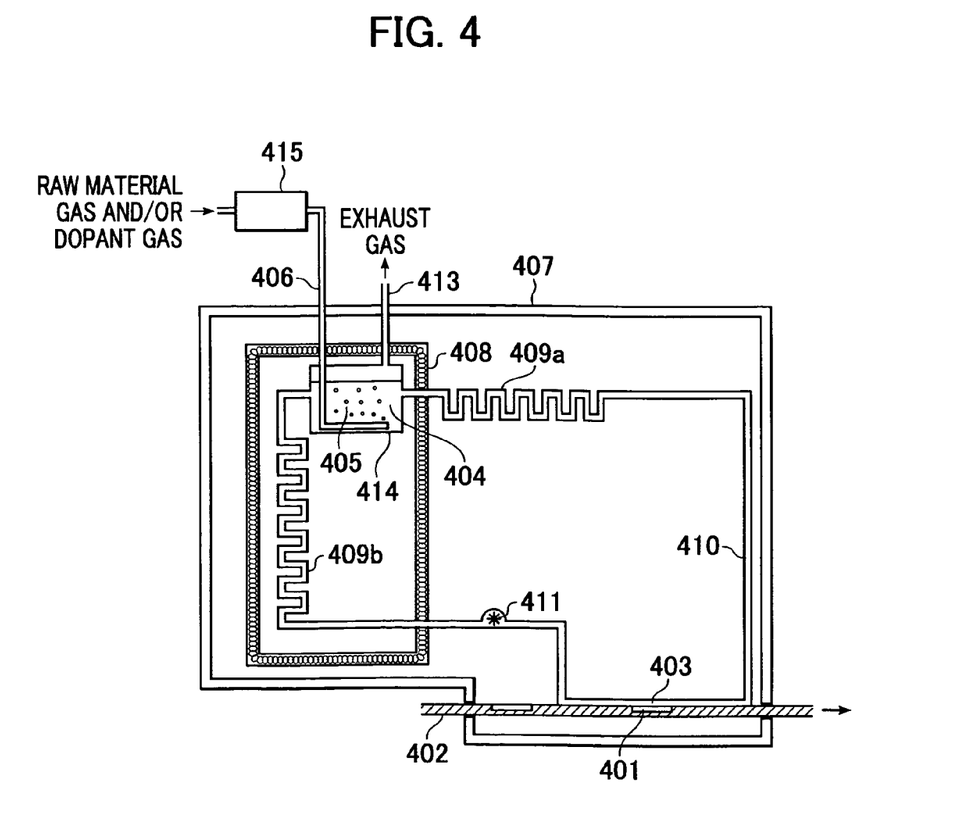
FIG. 4 is a sectional view schematically showing an example of a liquid phase growth apparatus according to the present invention, in which a substrate and a solvent is in contact with each other at an opening.

In Example 6, a Si layer was grown on a polycrystalline Si substrate through the use of an apparatus shown in FIG. 4. A solvent was In+Ga (Ga content: 0.1 atomic percent), and a raw material gas was $Si_2H_6$. Cast polycrystalline Si was processed to have a width of 40 mm, a length of 250 mm and a thickness of 0.6 mm, and was subjected to surface-polishing, followed by cleaning, in order to serve as the substrate.

With respect to the apparatus shown in FIG. 4, a solvent receiver 414 made of carbon and flat pipes 409a, 410 and 409b made of carbon are disposed in an electric furnace 407, while the 409a is connected to one side surface of the solvent receiver 414, the pipe 410 is in contact with a slider 402 carrying a plurality of substrates 401 at an opening 403, and the pipe 409b is connected to the other side surface of the solvent receiver 414. The pipes 409a and 409b serve as heat exchangers. Furthermore, the solvent receiver 414 and the heat exchanger 409b are surrounded by a heater block 408 and, therefore, the temperature can be controlled separately. Reference numeral 411 denotes a circulation rotor, reference numeral 415 denotes an energy application device, reference numeral 406 denotes a raw material gas feed pipe and reference numeral 413 denotes an exhaust hole. Reference numeral 404 denotes a solvent and reference numeral 405 denotes a reaction product gas.

The solvent 404 was In+Ga sufficiently purified in a hydrogen atmosphere. The solvent 404 was filled in the solvent receiver 414 and the flat pipes 409a, 410 and 409b. The location of the slider 402 was adjusted beforehand in order that the Si substrate 401 was not become in contact with the solvent 404 at the opening 403 of the flat pipe. The temperature in the electric furnace 407 was maintained at a constant 950° C. and, simultaneously, the temperature of the solvent receiver 414 was adjusted by the heater block 408 at 10° C. higher than the temperature in the electric furnace 407 outside the heater block 408. Subsequently, the solvent 404 was circulated through the use of the rotor 411. At this time, the length of the opening 403 was adjusted to be 100 mm, and the circulation velocity of the solvent 404 was adjusted at 40 mm/min. In the present Example, three Si substrates were arranged on the slider.

The raw material gas $Si_2H_6$ was fed into the raw material gas feed pipe 406 through the energy application device 415 (a synthetic quartz reaction chamber provided with an ultraviolet light (UV) irradiation apparatus), and was injected into the In+Ga solvent 404. The gas was kept on flowing. At this time, in the synthetic quartz reaction chamber, the raw material gas $Si_2H_6$ was irradiated with the UV (output 32 W: pulse energy 180 mJ) from an ArF excimer laser at a wavelength of 193 nm. After a lapse of 30 minutes, the polycrystalline Si substrate 401 was allowed to contact the In+Ga solvent 404 at the opening 403 while the slider 402 was moved at a feed speed of 20 mm/min and thereby, liquid phase growth was performed. When all of the plurality of polycrystalline Si substrates 401 passed through the opening 403, the movement of the slider 402 was stopped, so that the liquid phase growth was completed.

The cross section of the grown Si layer was observed with a scanning electron microscope and a transmission electron microscope. As a result, it was verified that the thickness of the grown Si layer was about 20 μm. The orientation of the grown Si layer was examined by an electron channeling pattern (ECP) method, and it was made clear that the crystal orientation of each grain in the polycrystalline Si substrate serving as a base material was followed. As described above, the crystalline Si layer was able to continuously grow while the substrate was moved.

In the case shown in Example 6, the substrate arranged on the slider was used. However, for example, it is also possible that a web-like substrate provided with an Si layer adhered to the surface is allowed to contact a solvent, and the Si layer is continuously grown while the substrate is moved roll-to-roll in one direction.

Example 7

In Example 7, an n⁺/p type thin-film single-crystal solar cell was prepared through the use of the liquid phase growth method of the present invention.

The apparatus shown in FIG. 1 was used, and an epitaxial Si layer was grown on a p⁺ Si wafer (ρ=0.01 Ω·cm) having a thickness of 500 μm in the same manner as that in Example 1, except that a raw material gas $SiH_4$ containing a doping gas $Ga(CH_3)_3$ and a $H_2$ gas (a ratio of the amounts of gas flow of $SiH_4:H_2=1:20$, and $Ga(CH_3)_3/SiH_4=0.03$) were fed into the raw material gas feed pipe 106 through the energy application device 112 (the plasma reaction chamber) and that the gradual cooling rate of the In solvent 104 was adjusted at −2° C./min.

The film thickness of the grown Si layer was evaluated by a height difference calculation method and the like, and was about 30 μm. A part of the grown Si layer was examined by secondary mass spectrometry and, as a result, about $2\times10^{16}$/$cm^3$ to $3\times10^{16}$/$cm^3$ of Ga was detected in the Si layer.

Thermal diffusion of P was performed at a temperature of 900° C. while $POCl_3$ served as a diffusion source, an n⁺ layer was formed on the surface of the grown Si layer, and a junction depth in the order of 0.5 μm was achieved. A dead layer of the formed n⁺ layer surface was wet-oxidized, and was removed by etching, so that a junction depth in the order of 0.2 μm was achieved with a proper surface concentration.

Finally, collecting electrode (Ti/Pd/Ag (40 nm/20 nm/2 μm))/SiN antireflective film (82 nm) was formed on the n⁺ layer, a back electrode was formed on the back of the substrate and, therefore, a solar cell was prepared.

With respect to the thus prepared thin-film single-crystal Si solar cell, the I–V characteristic under AM 1.5 (100 mW/$cm^2$) light irradiation was measured. As a result, the open-circuit voltage was 0.61 V, the short-circuit photocurrent was 34 mA/$cm^2$ and the fill factor was 0.78 at a cell area of 4 $cm^2$ and, thereby, the energy conversion efficiency of 16.2% was derived.

As described above, according to the preferred embodiments of the present invention, the raw material can be continuously supplied and the decomposition efficiency of the raw material gas and/or the gas containing the dopant can be increased in the liquid phase growth method for a silicon crystal. Consequently, the throughput of the crystal growth can be improved. Furthermore, the present invention is suitable as the mass production method for a device require to be thick, in particular, a solar cell.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A liquid phase growth method for a silicon crystal, in which a silicon crystal is grown on a substrate by immersing the substrate in a solvent or allowing the substrate to contact the solvent, comprising the step of:
   supplying a gas containing at least one of a raw material and a dopant to the solvent after at least a part of the gas is decomposed by application of energy to the gas.

2. The liquid phase growth method for a silicon crystal according to claim 1, wherein the energy is applied by at least one selected from the group consisting of heat, plasma, a catalyst and light.

3. The liquid phase growth method for a silicon crystal according to claim 1, wherein the solvent and at least one of the raw material and the dopant are agitated with at least one of (a) the gas containing at least one of the raw material and the dopant, (b) a gas resulting from decomposition of the gas containing at least one of the raw material and the dopant, and (c) a gas supplied to the solvent together with the gas containing at least one of the raw material and the dopant.

4. The liquid phase growth method for a silicon crystal according to claim 1, wherein the solvent and at least one of the raw material and the dopant are agitated with a mechanical device.

5. The liquid phase growth method for a silicon crystal according to claim 1, wherein a solvent comprising a metal is used as the solvent.

6. The liquid phase growth method for a silicon crystal according to claim 5, wherein the metal comprises at least one selected from the group consisting of In, Sn, Bi, Ga and Sb.

7. The liquid phase growth method for a silicon crystal according to claim 1, wherein the raw material comprises $SiH_4$.

8. The liquid phase growth method for a silicon crystal according to claim 1, wherein the raw material comprises $Si_nH_{2n+2}$ (where n represents an integer of 2 or more).

9. The liquid phase growth method for a silicon crystal according to claim 1, wherein the raw material comprises a halogenated silane.

10. The liquid phase growth method for a silicon crystal according to claim 1, wherein the dopant comprises at least one selected from the group consisting of $PH_3$, $PF_3$, $AsH_3$, $B_2H_6$, $BF_3$, $BCl_3$, $Ga(CH_3)_3$ and $Ga(C_2H_5)_3$.

11. A manufacturing method for a solar cell including at least a step of forming a silicon layer by liquid phase growth, comprising the step of:
supplying a gas containing at least one of a raw material and a dopant to a solvent after at least a part of the gas is decomposed by application of energy to the gas.

12. The manufacturing method for a solar cell according to claim 11, wherein the energy is applied by at least one selected from the group consisting of heat, plasma, a catalyst and light.

13. The manufacturing method for a solar cell according to claim 11, wherein the solvent and at least one of the raw material and the dopant are agitated with at least one of (a) the gas containing at least one of the raw material and the dopant, (b) a gas resulting from decomposition of the gas containing at least one of the raw material and the dopant, and (c) a gas supplied to the solvent together with the gas containing at least one of the raw material and the dopant.

14. The manufacturing method for a solar cell according to claim 11, wherein the solvent and at least one of the raw material and the dopant are agitated with a mechanical device.

15. The manufacturing method for a solar cell according to claim 11, wherein a solvent comprising a metal is used as the solvent.

16. The manufacturing method for a solar cell according to claim 15, wherein the metal comprises at least one selected from the group consisting of In, Sn, Bi, Ga and Sb.

17. The manufacturing method for a solar cell according to claim 11, wherein the raw material comprises $SiH_4$.

18. The manufacturing method for a solar cell according to claim 11, wherein the raw material comprises $Si_nH_{2n+2}$ (where n represents an integer of 2 or more).

19. The manufacturing method for a solar cell according to claim 11, wherein the raw material comprises a halogenated silane.

20. The manufacturing method for a solar cell according to claim 11, wherein the dopant comprises at least one selected from the group consisting of $PH_3$, $PF_3$, $AsH_3$, $B_2H_6$, $BF_3$, $BCl_3$, $Ga(CH_3)_3$ and $Ga(C_2H_5)_3$.

21. The manufacturing method for a solar cell according to claim 11, comprising the step of forming an n-type layer after the step of forming the silicon layer by liquid phase growth.

22. The manufacturing method for a solar cell according to claim 21, wherein the n-type layer is formed by allowing the dopant to diffuse into a part of the silicon layer.

* * * * *

UNITED STATES PATENT AND TRADEMARK OFFICE
CERTIFICATE OF CORRECTION

PATENT NO. : 7,118,625 B2
APPLICATION NO. : 10/676094
DATED : October 10, 2006
INVENTOR(S) : Shoji Nishida et al.

It is certified that error appears in the above-identified patent and that said Letters Patent is hereby corrected as shown below:

COLUMN 1
Line 64, "contacts" should read --contact--.

COLUMN 3
Line 55, "is" should read --are--.

COLUMN 5
Line 33, "than ever," should read --more than ever,--; and
Line 34, "efficient" should read --efficiency--.

COLUMN 6
Line 34, "temporally" should read --temporarily--.

COLUMN 9
Line 1, "than ever" should read --more than ever--.

COLUMN 10
Line 28, "was held" should read --were held--; and
Line 39, "was" should read --were--.

COLUMN 11
Line 67, "was" should read --were--.

COLUMN 12
Line 43, "while the" should read --while the pipe--.

UNITED STATES PATENT AND TRADEMARK OFFICE
CERTIFICATE OF CORRECTION

PATENT NO. : 7,118,625 B2  
APPLICATION NO. : 10/676094  
DATED : October 10, 2006  
INVENTOR(S) : Shoji Nishida et al.

It is certified that error appears in the above-identified patent and that said Letters Patent is hereby corrected as shown below:

COLUMN 14
Line 17, "require" should read --required--.

Signed and Sealed this

Seventeenth Day of April, 2007

JON W. DUDAS  
*Director of the United States Patent and Trademark Office*